BEAM LEAD PLATING PROCESS

Filed March 22, 1971

INVENTORS
MICHAEL T. NASH
BY
Robert G. Rogers
ATTORNEY

United States Patent Office 3,699,010
Patented Oct. 17, 1972

3,699,010

BEAM LEAD PLATING PROCESS

Michael T. Nash, Orange, Calif., assignor to North American Rockwell Corporation Filed Mar. 22, 1971, Ser. No. 126,810
Int. Cl. C23b 5/48; B23k 31/02; B29c 17/08
U.S. Cl. 204—15 6 Claims

ABSTRACT OF THE DISCLOSURE

A nickel (or copper) layer on the surface of a semiconductor wafer is etched to define a pattern for the cantilevered portions of beam leads. The remaining portion of the layer is not removed for providing an improved electrical conductor on the surface of the semiconductor wafer when gold beam leads are subsequently electro-deposited.

BACKGROUND OF THE INVENTION

(1) Field of the invention

The invention relates to a beam lead plating process and more particularly to an improved process in which a nickel layer is partially etched to define the cantilevered portion of beam leads with the unetched portion of the layer being used as an improved electrical conductor during the subsequent electro-deposition step when the beam leads are formed.

(2) Description of prior art

One prior art process is described in patent application Ser. No. 62,283, filed Aug. 31, 1970, for "A Process for Laser Scribing Beam Lead Semiconductor Wafers" by Ronald E. Harris et al. In that patent application, a process is described wherein the copper layer 30, interposed between a chrome layer 29, and gold layer 21 is etched from the surface of the semiconductor wafer except under the contact portion of the beam leads being produced. The copper layer is ordinarily used to prevent the gold and chrome layers from diffusing together.

As indicated in the patent application, the gold layer 21 is vacuum deposited and the beam lead gold layer 20 is electro-deposited, or electro-plated, onto the semiconductor surface through a mask defining the location of the beam leads.

Electro-plating usually requires that a circuit board, or semiconductor wafer, as in the present application, comprise one electrode in a plating solution. Current passing from the other electrode in the solution to the semiconductor chip causes a deposition to occur. It should be obvious therefore that if the conductivity of the semiconductor chip can be improved, the quality of the deposition can also be improved.

A process is preferred in which the electro-plating of the beam lead can be improved by improving the conductivity of the semiconductor chip in a plating solution. The present invention provides such an improved process.

SUMMARY OF THE INVENTION

Briefly, the invention comprises a process for forming beam leads in which a nickel or copper layer is deposited between chrome and gold layers initially for preventing the chrome and gold layers from diffusing together. The gold layer is etched to the nickel layer for defining the contact portions of the beam leads. The semiconductor wafer is masked for exposing only the beam lead areas. The nickel layer is then etched to define the cantilevered portions of the beam leads. The remaining portions of the nickel layer are not etched for providing an improved electrical conductivity layer on the semiconductor wafer surface during the subsequent electrodeposition of the gold forming the beam leads.

The semiconductor wafer is immersed in a plating solution with one electrode comprising the unetched portions of the nickel layer. The other electrode is placed in the solution with the semiconductor wafer. As a result, gold is electrodeposited through the mask onto the exposed gold layers for forming the fixed portion of the beam lead and in the recessed or trough-like areas in the nickel layer for forming the cantilevered portion of the beam lead. Afterwards the unetched nickel layer and chrome layer are removed.

Therefore, it is an object of this invention to provide an improved beam lead plating process.

It is another object of this invention to provide an electrically conducting layer on the beam lead surface etched to define the cantilevered portion of the beam leads, for providing an improved conductivity layer on the beam lead surface.

Another object of this invention is to provide a beam lead process in which the cantilevered portion of the beam lead is partially deposited into a recess through a nickel conducting layer appropriately masked on a semiconductor substrate.

A still further object of this invention is to provide an improved beam lead plating process in which the deposition of the electro-deposited metal comprising the beam lead is improved by providing a conducting layer on the semiconductor wafer surface.

These and other objects of this invention will become more apparent when taken in connection with the description of the drawings, a brief description of which follows:

DESCRIPTION OF PREFERRED EMBODIMENT

Figure 1:
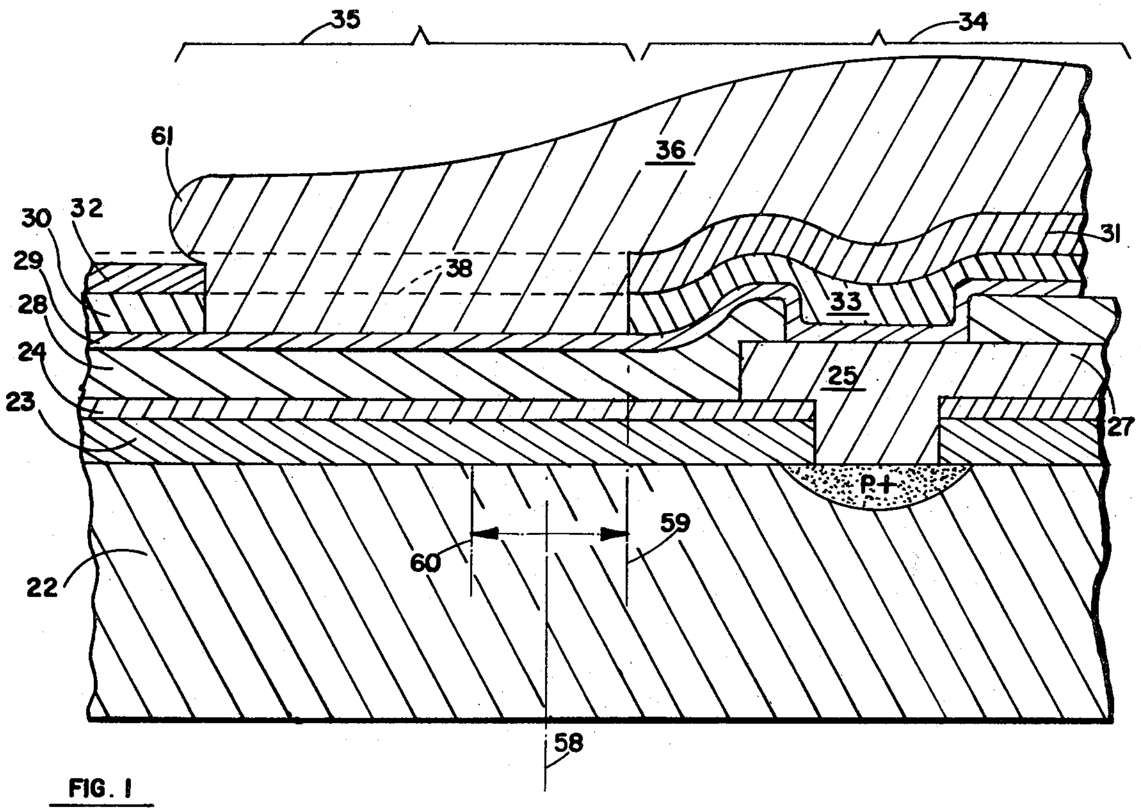
FIG. 1 is a cross-sectional view of a beam lead formed on a semiconductor wafer in accordance with the present process.

FIG. 1 is a cross-sectional view of a semiconductor wafer 22 on which a beam lead has been produced in a series of process steps. In Step 1, the semiconductor wafer such as N-type silicon is appropriately masked and impurities are diffused into the unmasked regions for forming PN junctions and N+ regions in the semiconductor wafer as part of a P-MOS or C-MOS process. The diffusion step also produces a thermally grown oxide layer 23 such as $SiO_2$ on the wafer surface.

It is pointed out that devices other than MOS devices can also be produced within the scope of the invention. For example, MNOS devices, silicon gate devices and other devices known to persons skilled in the art can also be produced. When interconnected, the devices form individual microelectronic circuits on separate portions of the semiconductor wafer. The independent wafer portions are subsequently separated into semiconductor chips.

In Step 2, a passivating film such as silicon nitride film 29 is deposited over the $SiO_2$ layer 23 on the semiconductor wafer 22. In one process, a silicon nitride film may be deposited by reacting silane and ammonia in a hydrogen amibent. The wafer is maintained at a required temperature in an inductively heated reactor. A silicon nitride film having a thickness of, for example, 350 A. provides an adequate contamination barrier for the wafer.

In addition an insulating film (not shown) such as silicon dioxide is reactively deposited on top of the silicon nitride film for use as an etch mask. A film of, for example 1000 A., is satisfactory for that purpose. Silicon dioxide may be deposited, for example, by reacting silane with oxygen in a nitrogen ambient. However, other techniques may also be used to deposit the silicon dioxide film.

In Step 3, a layer of photoresist (not shown) is deposited over the silicon dioxide film and developed for exposing certain areas of the silicon dioxide. The exposed silicon dioxide areas are etched with a standard etchant to expose the silicon nitride layer 24 which is also etched, for example, with a hot phosphoric acid etchant. The underlying thermally grown silicon dioxide layer 23 is then removed by a standard etchant for exposing the silicon wafer surface. The exposed surface areas define contact regions. For example, the contact regions may comprise a source or drain electrode for a field effect transistor. A gate electrode can be deposited over a region silicon dioxide layer.

After portions of the semiconductor wafer surface have been exposed, a conducting metal layer 27 such as aluminum is deposited, for example, by vacuum techniques, masked and etched to form metal contacts and the conductors for the individual circuit patterns of a plurality of microelectronic circuits formed in the wafer. A wafer comprises a number of semiconductor chips each including a microelectronic circuit. The masking and etching techniques for forming the metal contacts and circuit conductors are well known to persons skilled in the art.

In Step 4, silicon dioxide ($SiO_2$) layer 28 is chemically vapor deposited over the entire semiconductor wafer surface for mechanically protecting the conductors and contacts of the microelectronic circuits. The $SiO_2$ layer is masked and etched to expose contact regions such as contact 25 about the peripheries of each microelectronic circuit. Subsequently, a relatively thin chrome layer 29 is deposited over the entire wafer surface and on the exposed aluminum contact exemplified by contact 25. A chrome layer may be evaporated from a molybdenum container on the wafer maintained at a temperature of approximately 200° C. and at a pressure of approximately $10^{-6}$ torr. A thickness of approximately 1,000 A. is satisfactory.

Without removing the semiconductor wafer 22 from the vacuum chamber, a second metal layer 30 such as nickel or copper is deposited on the chrome layer. Nickel is the preferred metal. Layer 30 is evaporated on the chrome to a thickness of approximately 4,000 A. Following the deposition of layer 30, a third metal layer 31, such as gold, is vacuum deposited over the copper layer. The gold may have a thickness of approximately 4,000 A. Layer 30 separates the chrome and gold layers for preventing the two layers to diffuse together. The aluminum layer also prevents the copper layer from contaminating the silicon wafer.

In Step 5, after the gold layer 31 has been deposited, it is suitably masked with a photoresist material (not shown) and etched to form a base for the adhering portions of the beam lead as exemplified by the unetched portion of layer 31. The etched portion is represented by the dashed line 32. Subsequently, the nickel layer exposed after the gold layer has been etched is masked and etched to define a base portion 34 for the cantilevered portion 35 of the beam lead 36 (see Step 6). In other words, troughs, or channels are etched in the nickel layer as illustrated in FIG. 1 by the dashed line 38. The portion 33 of the nickel layer masked by the unetched portion of the gold layer 31 is not etched. Similarly, the portion of the nickel layer 30 masked by the photoresist layer 32 is not etched. Etchants for gold and nickel as well as for copper are well known to persons skilled in the art.

The chromium layer 29 exposed when the nickel is removed may be subjected to an etchant such as potassium hydroxide or potassium permanganate followed by a water rinse so that the chromium surface is slightly cleaned and slightly passivated i.e. less than completely cleaned and less than completely passivated. The oxide on the chromium surface forms an insulating layer which in effect interferes with the plating of gold. If the surface is completely cleaned of oxide etc. the gold subsequently deposited plates on the chrome surface and adheres. However, by slightly passivating the chrome surface the gold only slightly adheres. The non-adhering nature of gold on a relatively passivated chrome surface enables the beam lead for adjacent micro-circuits in the wafer to be produced in an interdigitated manner as shown in FIG. 3. However, in other embodiments, the beam leads can be produced in other than interdigitated form. Therefore, in other embodiments it may not be necessary to treat the chrome surface as described.

In Step 6, the exposed surfaces of the chromium layer as well as the exposed surfaces of the gold layer 21 are electroplated with gold in the preferred embodiment. Electroplating techniques are well known to persons skilled in the art. In one example, gold may be plated on the base gold layer exemplified by the unetched portion of gold layer 31 directly on top of the surface of chromium layer 29 in the area exposed by the photoresist masking layer 32. Beam lead 36 is an example of a plated gold beam lead.

Figure 2:
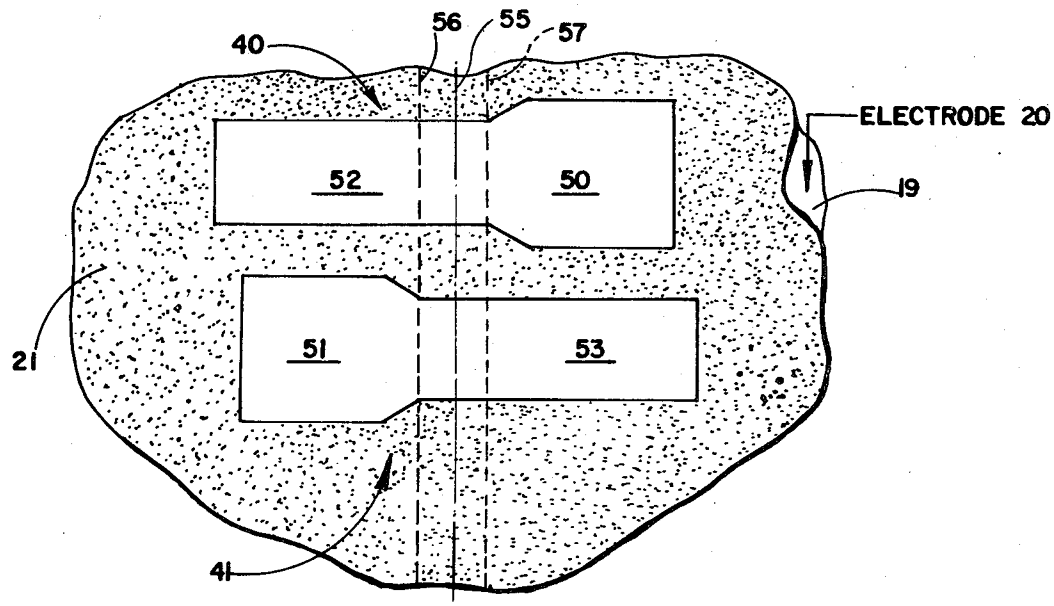
FIG. 2 is a top view of a semiconductor chip showing the fixed and cantilevered portions of beam leads on adjacent semiconductor chips before being separated.

FIG. 2 shows beam leads 40 and 41 having adhering portions 50 and 51 and non-adhering (cantilevered) portions 52 and 53. The dots on the surface of the FIG. 2 structure represents a photoresist layer 21 corresponding to the photoresist layer 32 of FIG. 1. Line 55 represents the preferred scribe line although describing can be accomplished within the space between lines 56 and 57. The scribe line and scribe limit lines are identified in FIG. 1 by numerals 58, 59, and 60.

When the gold is electroplated, it is desirable to use part of the semiconductor structure as, for example, a negative electrode. An illustration of connecting an electrode 20 to an unetched part of a nickel layer 19 is also shown. The nickel layer corresponds to nickel layer 30 in FIG. 1. The container for the electroplating bath would then be made the positive electrode. The gold in the solution is transported by the electrical action between the poles onto the exposed metallic surfaces. For the embodiment described, the gold is deposited in the troughs etched through the nickel layer, the unmasked portion of which is masked by the photoresist layer 32.

Plating experience has indicated that where the underlying metal layer is not a good conductor, the electrodeposited gold metal is often of a poor quality, lacks uniformity, and requires a considerable length of time for its deposition. In order to overcome the problem, the nickel layer was only etched, as indicated above, to define a trough for the cantilevered portion of the beam lead. The remaining part of the nickel layer 30 was unetched so that it could be connected as a negative electrode for the semiconductor wafer. As a result, the conductivity on the wafer surface is improved and the deposition of the gold layer forming the beam lead 36 shown in FIG. 1 is substantially improved. The photoresist layer 32 prevents the gold from being deposited throughout the surface. Since the electric field is stronger in the channel or trough area the gold is deposited in those areas and not on top of the photoresist layer. A slight mushrooming effect occurs as shown at the tip 61 of the beam lead 36.

Following the electro-deposition of the beam lead, the photoresist layer 32 is removed and the remaining portion of the nickel layer 30 is etched. In addition, the chrome layer 29 exposed after the nickel layer has been etched is also etched and removed.

It is pointed out that the FIG. 1 is not drawn to scale. For example, the gold plated beam lead 36 does not show a thickness equivalent to 120,000 angstroms when compared with the underlying vacuum deposited gold layer 31 which is described as having a thickness of approximately 4,000 angstroms. Similarly, the semiconductor wafer 22 may have a thickness of 10 mils which is substantially thicker than the gold plated beam lead 36 shown in FIG. 1. After the exposed nickel and chrome layers have been removed, the wafer is scribed along the line 58 indicated for dividing a wafer into chips each comprising or embodying a microelectronic circuit. Various scribing techniques are used to divide the wafer into chips. After the wafer has been scribed, the chips are separated and the beam lead separates from the underlying chrome layer. The cantilevered portion protrudes from the edge of the chip and may be used to provide electrical connections to a microelectronic circuit embodied by the chip.

I claim:

1. A process for forming beam leads from a semiconductor substrate composite including sequential layers of gold, nickel and chrome and comprising the steps of, first etching a relatively thin gold layer on the surface of a semiconductor substrate into a pattern defining fixed portions of beam leads, masking a nickel layer exposed by said first etching step for defining cantilevered portions of beam leads, second etching the unmasked portion of the nickel layer for forming a recess region through the nickel layer for exposing the underlying chrome layer, the masked portion of the nickel layer being unetched, providing an electrical connection to the unetched portions of the nickel layer for improving the electrical conductivity of the surface of the semiconductor chip during an electro-deposition step in which the metal comprising the beam lead is deposited, and removing said masking layer and etching the exposed nickel layer.

2. A beam lead plating process comprising the steps of, forming an insulation on the surface of a semiconductor substrate, producing electrical contacts on the surface of said semiconductor wafer through said insulation, forming an insulating film over the surface of said insulating layer including openings for exposing a surface portion of said electrical contacts, depositing a relatively thin film of a passivatable metal over the semiconductor surface and on the exposed portion of said electrical contact, depositing a layer of a first electrically conducting metal over the passivatable metal film, depositing a layer of a second electrically conducting metal over said first layer for providing an adhering surface for the fixed portion of a beam lead, said first metal layer preventing a diffusion of said second layer and said passivatable metal layer, first removing portions of said second metal layer for defining the fixed portion of a beam lead, second removing portions of said first metal layer down to said passivatable metal film for defining the cantilevered portion of said beam leads, the remaining portions of said first metal layer remaining on the semiconductor surface, providing an electrical connection to the remaining portion of said first metal layer and immersing said semiconductor surface in a solution for providing an electro-deposition onto the areas defining the fixed and cantilevered portions of the beam leads, third removing the remaining portion of the first metal layer.

3. The process recited in claim 2 wherein said first metal layer is nickel, said second metal layer is gold, and said passivatable film is chrome.

4. The process recited in claim 2 wherein said first metal layer is copper, said second metal layer is gold, and said passivatable film is chrome.

5. The process recited in claim 3 wherein said semiconductor wafer is separated into semiconductor chips each having beam leads with cantilevered extensions.

6. In a beam lead forming process in which the beam lead is formed by electro-plating gold onto a gold layer defining the fixed portion of the beam lead and onto a chrome layer defining the cantilevered portion of the beam lead, the improvement comprising the steps of, etching only the portion of a nickel layer defining the cantilevered portions of the beam lead, the remaining unetched portions of said nickel layer providing an improved electrical conductor during the electro-deposition step in which the beam lead is formed, removing the previously unetched portion of said nickel layer following the formation of said beam lead.

References Cited

UNITED STATES PATENTS

| | | | |
|---|---|---|---|
| 3,421,985 | 1/1969 | Baker et al. | 204—15 |
| 3,528,090 | 9/1970 | Van Laer | 29—578 |
| 3,449,825 | 6/1969 | Loro | 317—235 |

JOHN H. MACK, Primary Examiner

T. TUFARIELLO, Assistant Examiner

U.S. Cl. X.R.

29—580; 156—11; 317—234 M, 234 N